United States Patent
Ito et al.

(10) Patent No.: US 6,342,783 B1
(45) Date of Patent: Jan. 29, 2002

(54) ELECTROOPTIC PROBE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/416,504

(22) Filed: Oct. 8, 1999

(30) Foreign Application Priority Data

Oct. 9, 1998 (JP) .............................. 10-288547

(51) Int. Cl.⁷ ...................... G01R 31/00; G01R 31/308; G01R 31/02
(52) U.S. Cl. .......................... 324/96; 324/753; 324/754
(58) Field of Search ..................... 324/96, 754, 753, 324/750, 751, 752, 761, 72.5, 149; 359/245

(56) References Cited

U.S. PATENT DOCUMENTS

| | | | | |
|---|---|---|---|---|
| 4,920,310 A | * | 4/1990 | Aoshima | 324/96 |
| 5,105,148 A | | 4/1992 | Lee | |
| 5,124,645 A | * | 6/1992 | Rhoden et al. | 324/754 |
| 5,465,043 A | * | 11/1995 | Sakai | 324/96 |

FOREIGN PATENT DOCUMENTS

| | | |
|---|---|---|
| EP | 0645635 | 3/1995 |
| JP | 10-268003 | 10/1998 |
| WO | WO89/09416 | 10/1989 |

* cited by examiner

Primary Examiner—Safet Metjahic
Assistant Examiner—Anjan K Deb
(74) Attorney, Agent, or Firm—Blakely Sokoloff Taylor & Zafman

(57) ABSTRACT

An electrooptic probe which can facilitate replacement of a metallic pin. A probe head constituting a tip end portion of a probe body including a head body for retaining an electrooptic element and a tip member detachably provided on the head body for retaining the metallic pin.

9 Claims, 4 Drawing Sheets

ELECTROOPTIC PROBE

BACKGROUND OF THE INVENTION

1. Field of the Invention

The present invention relates to a probe for an electrooptic sampling oscilloscope that couples an electrical field generated by a measurement signal and an electrooptic crystal, inputs a beam into this electrooptic crystal, and measures the waveform of the measurement signal by the state of the polarization of the input light.

This application is based on Japanese Patent Application, No. Hei 10-288547 filed in Japan, the content of which is incorporated herein by reference.

2. Description of the Related Art

It is possible to couple an electrical field generated by a measurement signal with an electrooptic crystal, input a laser beam into this electrooptic crystal, and observe the waveform of the measurement signal by the state of the polarization of the laser beam. It is possible to pulse the laser beam, and observe with an extremely high time resolution when sampling the measurement signal. The electrooptic sampling oscilloscope uses an electrooptic probe exploiting this phenomenon.

When this electrooptic sampling oscilloscope (hereinbelow, referred to as an "EOS oscilloscope") is compared to a conventional sampling oscilloscope using an electrical probe, the following characteristics have received much attention:

1. It is easy to observe the signal because a ground wire is unnecessary.
2. Because the metal pin at the end of the electrooptic probe is not connected to the circuit system, it is possible to realize high input impedance, and as a result of this, there is almost no degradation of the state of the measurement point.
3. By using an optical pulse, broadband measurement up to the GHz order is possible.

The structure of a probe for an EOS oscilloscope in the conventional technology will be explained using FIG. 7. In the electrooptic probe 1 shown in FIG. 7, a probe head 3 comprising an insulator is mounted on a tip end of a metallic probe body 2, and a metallic pin 3a is fitted into the center. An electrooptic element 4 is secured to the probe head 3. A reflecting film 4a is provided on an end surface of the electrooptic element 4 on the metallic pin 3a side, and is in contact with the metallic pin 3a. Reference numeral 5 denotes a ½ wavelength plate, and reference numeral 6 denotes a ¼ wavelength plate. Reference numeral 7 and 8 denote polarized beam splitters. Reference numeral 9 denotes a ½ wavelength plate, and reference numeral 10 denotes a Faraday element. Reference numeral 12 denotes a collimator lens, and reference numeral 13 denotes a laser diode. Reference numerals 14 and 15 denote condensing lenses, and reference numerals 16 and 17 denote photodiodes.

In addition, the two polarized beam splitters 7 and 8, the ½ wavelength plate 9, and the Faraday element 10 constitute an isolator 19 that transmits the light emitted by the laser diode 13, in order to separate the light reflected by the reflecting film 4a.

Next, referring to FIG. 7, the optical path of the laser beam emitted from the laser diode 13 is explained. In FIG. 7, reference letter 'A' denotes the optical path of the laser beam.

First, the laser beam emitted from the laser diode 13 is converted by the collimator lens 12 into a parallel beam that travels straight through the polarized beam splitter 8, the Faraday element 10, the ½ wavelength plate 9, and the polarized light beam splitter 7, and then transits the ¼ wavelength plate 6 and the ½ wavelength plate 5, and is incident on the electrooptic element 4. The incident light is reflected by the reflecting film 4a formed on the end surface of the electrooptic element 4 on the side facing the metallic pin 3a.

The reflected laser beam then transits the ½ wavelength plate 5 and the ¼ wavelength plate 6, one part of the laser beam is reflected by the polarized light beam splitter 7, condensed by the condensing lens 14, and impinges on the photodiode 16. The laser beam that has transited the polarized light beam splitter 7 is reflected by the polarized beam splitter 8, condensed by the condensing lens 15, and impinges on the photodiode 17.

Moreover, the angle of rotation of the ½ wavelength plate 5 and the ¼ wavelength plate 6 is adjusted so that the strength of the laser beam incident on the photodiode 16 and the photodiode 17 is uniform.

Next, using the electrooptic probe 1 shown in FIG. 7, the procedure for measuring the measurement signal is explained.

When the metallic pin 3a is placed in contact with a measurement point, at the electrooptic element 4 the electrical field due to the voltage applied to the metallic pin 3a is propagated to the electrooptic element 4, and a phenomenon where the refractive index is altered due to the Pockels effect occurs. Due to this, the laser beam emitted from the laser diode 13 impinges on the electrooptic element 4, and when the laser beam is propagated along the electrooptic element 4, the polarization state of the beam changes. Then, the laser beam having this changed polarization state is reflected by the reflecting film 4a, condensed and impinged on the photodiode 16 and the photodiode 17, and converted into an electrical signal.

Along with the change in the voltage at the measurement point, the change in the state of polarization by the electrooptic element 4 becomes the output difference between the photodiode 16 and the photodiode 17, and by detecting this output difference, it is possible to measure the electrical signal applied to the metallic pin 3a.

Moreover, in the above-described electrooptic probe 1, the electrical signals obtained from the photodiodes 16 and 17 are input into an electrooptic sampling oscilloscope, and processed. However, instead, it is possible to measure the signals by connecting a conventional measuring device such as a real time oscilloscope to the photodiodes 16 and 17 via a dedicated controller. In this way, it is possible to carry out simply broadband measurement by using the electrooptic probe 1.

In the manner described above, in the signal measurement using the electrooptic probe 1, because the metallic pin 3a must contact the measurement point, the metallic pin 3a is worn by repeated measurement so that it is necessary to replace the probe head 3. In this case, since the electrooptic element 4 which is fixed to the probe head 3 is expensive, cost is increased.

Furthermore, considering the fact that in general the type of most suitable metallic pin changes depending on the characteristics of the signal of the measurement object, then since with the abovementioned electrooptic probe 1 the metallic pin 3a is secured to the probe head 3, in selecting the most suitable metallic pin 3a to match the characteristics of the signal to be measured, it is difficult to obtain a suitable match.

SUMMARY OF THE INVENTION

In consideration of the above described situation, it is an object of the present invention to provide an electrooptic probe which can facilitate replacement of the metallic pin.

In order to address the above problems, the present invention adopts the following means.

A first aspect of the present invention is an electrooptic probe wherein:

an optical path is formed within a probe body between a base end portion and a tip end portion of the probe body;

a laser diode is disposed at an end of the optical path on the base end portion side of the probe body;

an electrooptic element is disposed at an other end of the optical path on the tip end portion side of the probe body and retained in a probe head constituting the tip end portion of the probe body;

a metallic pin is provided in the probe head with a base end thereof connected to the electrooptic element, and a tip end thereof protruding from the probe head, a laser beam emitted from the laser diode is incident on the electrooptic element via the optical path, and this incident beam is reflected by a reflecting film provided on the electrooptic element, and the reflected beam thereof is separated and converted into an electrical signal by a photodiode; and wherein the probe head comprises a head body for retaining the electrooptic element, and a tip member detachably provided on the head body for retaining the metallic pin.

Because of this kind of construction, with this electrooptic probe, replacement of the metallic pin can be easily performed by replacing the tip member.

A second aspect of the present invention is an electrooptic probe according to the first aspect, wherein the photodiode and the laser diode are connected to an electrooptic sampling oscilloscope, and the laser diode generates the laser beam as a pulsed beam based on a control signal from the electrooptic sampling oscilloscope.

A third aspect of the present invention is an electrooptic probe according to the second aspect, wherein a male threaded portion is provided in one of the head body and the tip member protruding towards the other of the two, while in the other of the two, a female threaded portion is formed for engaging with the male threaded portion, and the male threaded portion and the female threaded portion are able to be engaged and disengaged.

A fourth aspect of the present invention is an electrooptic probe according to the second aspect, wherein a threaded aperture is provided in the tip member, and the tip member is secured to the head body by means of a screw disposed in the threaded aperture.

A fifth aspect of the present invention is an electrooptic probe according to the second aspect, wherein the electrooptic element and the base end of the metallic pin are connected to each other through the medium of a buffer plate for absorbing shock due to contact between the electrooptic element and the metallic pin.

Because of being structured in this manner, then with the electrooptic probe, when the tip member is attached to or detached from the probe body, damage to the electrooptic element due to contact with the metallic pin can be prevented.

A sixth aspect of the present invention is an electrooptic probe according to the first aspect, wherein the laser diode generates a continuous beam as the laser beam.

In this manner, with the electrooptic probe according to the sixth aspect, a continuous beam is generated from the laser diode and thereby it is possible to obtain a continuous output from the photodiode. Consequently, it is also possible to make measurements by connecting the photodiode via a special purpose controller to a conventional general use measuring device such as a real time oscilloscope.

A seventh aspect of the present invention is an electrooptic probe according to the sixth aspect, wherein a male threaded portion is provided in one of the head body and the tip member protruding towards the other of the two, while in the other of the two, a female threaded portion is formed for engaging with the make threaded portion, and the male threaded portion and the female threaded portion are able to be engaged and disengaged.

An eighth aspect of the present invention is an electrooptic probe according to the sixth aspect, wherein a threaded aperture is provided in the tip member, and the tip member is secured to the head body by means of a screw disposed in the threaded aperture.

A ninth aspect of the present invention is an electrooptic probe according to the sixth aspect, wherein the electrooptic element and the base end of the metallic pin are connected to each other through the medium of a buffer plate for absorbing shock due to contact between the electrooptic element and the metallic pin.

Because of being structured in this manner, then with the electrooptic probe, when the tip member is attached to or detached from the probe body, damage to the electrooptic element due to contact with the metallic pin can be prevented.

DESCRIPTION OF THE PREFERRED EMBODIMENTS

An embodiment of the present invention will be explained with reference to the drawings.

Figure 1:
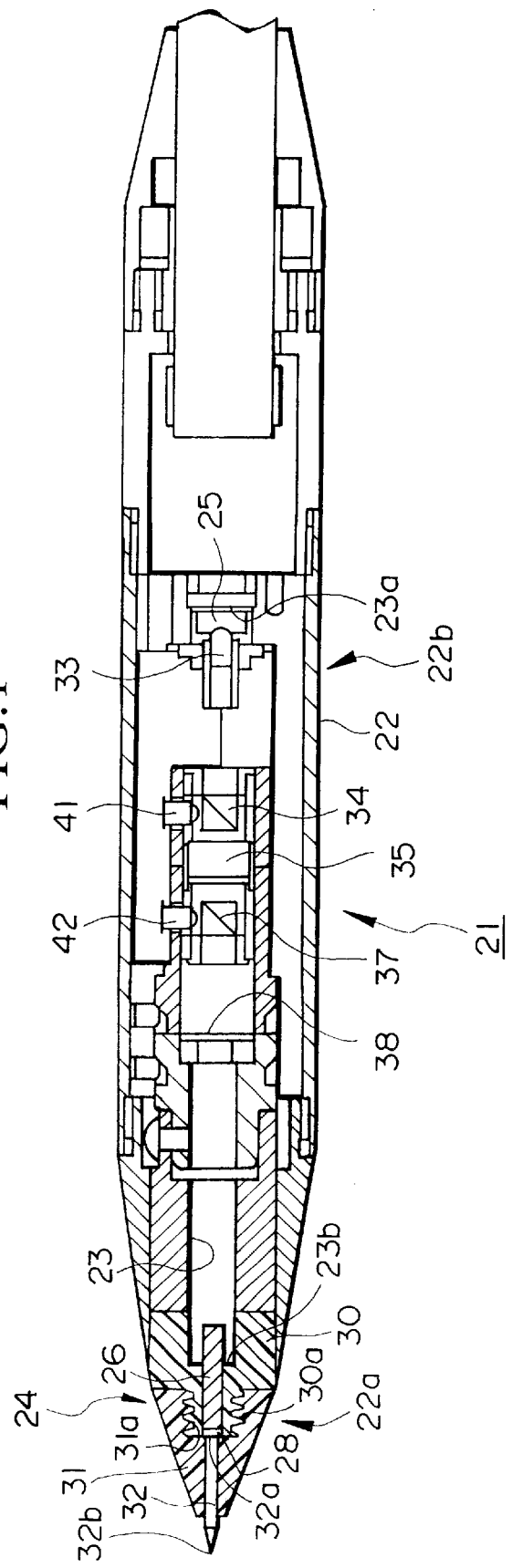
FIG. 1 is a cross-section view of an electrooptic probe schematically showing an embodiment of the present invention.
Figure 2:
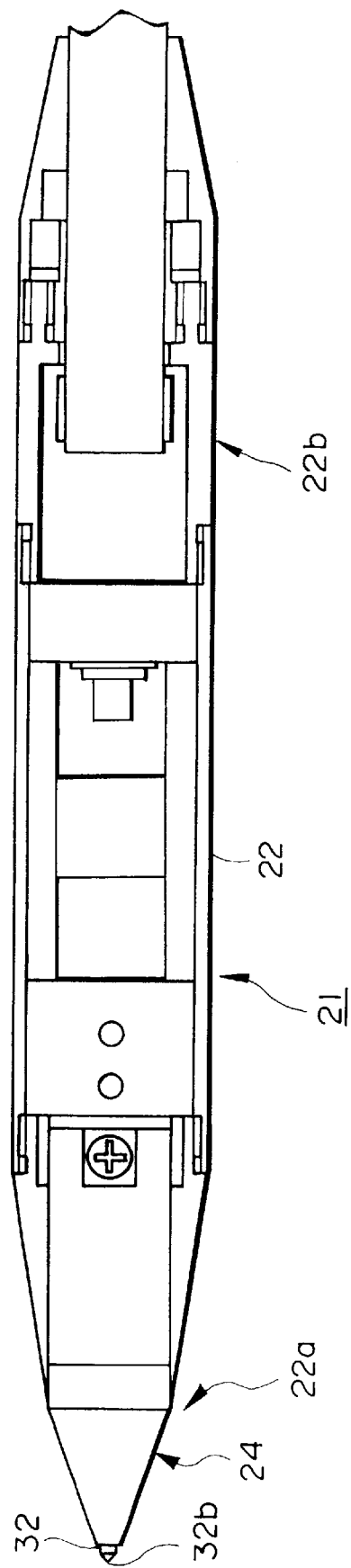
FIG. 2 is a plan view of the electrooptic probe shown in FIG. 1.

FIG. 1 and FIG. 2 are respectively cross-sectional and plan views of an electrooptic probe 21 illustrating an embodiment of the present invention. This electrooptic probe 21 shows the schematic structure of an optical path 23 formed inside a probe body 22.

A tip end portion 22a of the probe body 22 is formed as a probe head 24, and in a base end 22b of the probe body 22 a laser diode 25 is accommodated. The laser diode 25 is positioned at one end 23a on the base end 22b side of the probe body 22 in the optical path 23, and connected to an EOS oscilloscope, omitted from the drawings.

At an other end 23b on the tip end portion 22a side of the probe body 22 in the optical path 23, an electrooptic element 26 is disposed. The electrooptic element 26 is retained by the probe head 24, and on an end surface 26a of the electrooptic element 26 on the tip end portion 22a side of the probe body 22, a reflecting film 28 is formed.

Moreover, the probe head 24 comprises a head body 30 for securing to the electrooptic element 26, and a tip member 31 further provided on a tip end of the head body 30. As shown in the figure, a male threaded portion 30a is provided on the head body 30 protruding towards the tip member 31 side, while in the tip member 31, a female threaded portion 31a is provided so as to be engagable with the male threaded portion 30a. By means of the male threaded portion 30a and the female threaded portion 31a, the tip member 31 can be attached to and detached from the head body 30.

Furthermore, a metallic pin 32 is secured to the tip member 31. With the metallic pin 32, a base end 32a thereof is connected to the electrooptic element 26. Moreover, a tip end 32b thereof protrudes from the tip member 31.

As shown in FIG. 1, on the optical path 23, in order from the right in the figure, a collimator lens 33, a polarized beam splitter 34, a Faraday element 35, a polarized beam splitter 37, and a ¼ wavelength plate 38 are disposed. In addition, at the positions corresponding to the polarized beam splitters 34 and 37 on the side of the optical path 23, photodiodes 41 and 42 are respectively installed. These photodiodes 41 and 42 are connected to an EOS oscilloscope, and convert the incident beam into an electrical signal, and can send the signal to the EOS oscilloscope.

In addition, the polarized beam splitters 34 and 37 can function as an isolator that separates a part of the light transiting the optical path 23, and makes this incident on the photodiodes 41 and 42.

When the electrooptic probe 21 is used in signal measurement, the tip end 32b of the metallic pin 32 is placed in contact with the measurement point, and the EOS oscilloscope is activated. Thereby, based on the control signal generated from the EOS oscilloscope, a laser beam is emitted from the laser diode 25, and this laser beam is converted into a parallel beam by the collimator lens 33, transits the optical path 23, and arrives at the electrooptic element 26.

The laser beam that has arrived at the electrooptic element 26 impinges on the reflecting film 28, and is reflected and progresses along the optical path 23 to the laser diode 25 side. At this time, because the refractive index of the electrooptic element 26 fluctuates due to the fluctuation in the electrical field of the measurement point propagated via the metallic pin 32, the polarization state of the laser beam fluctuates when propagating through the electrooptic element 26, and the reflected light with fluctuations in the polarization is separated by the polarized beam splitters 34 and 37, focused and impinged on the photodiodes 41 and 42, and converted into an electrical signal. Thereby, the fluctuation in the polarization state of the laser beam is detected as an output difference of photodiodes 41 and 42, so that it is possible to measure the electrical signal of the measurement point.

In the case of repeatedly performing signal measurement in this manner, the metallic pin 32 wears from the tip end 32b side thereof. Consequently it is necessary to replace the metallic pin 32. However, in this case, since with the electrooptic probe 21, the tip member 31 can be attached to and detached from the head body 30, then if the metallic pin 32 is replaced together with the tip member 31, replacement of the metallic pin 32 can be easily performed. As a result, with replacement of the metallic pin 32, in contrast to the conventional situation, it is not necessary to replace the whole probe head 24. Hence, replacement of the high cost electrooptic element 26 becomes unnecessary so that there is a cost benefit.

Moreover, with this electrooptic probe 21, since the tip member 31 can be easily replaced with one fitted with the most suitable metallic pin 32 to match the characteristics of the signal of the measurement object, then compared to heretofore, measurement accuracy can be improved.

An example of the embodiment of the present invention has been explained above. However the present invention is not limited thereby, and it is possible to alter the shape and structure without departing from the gist of the invention.

Figure 3:
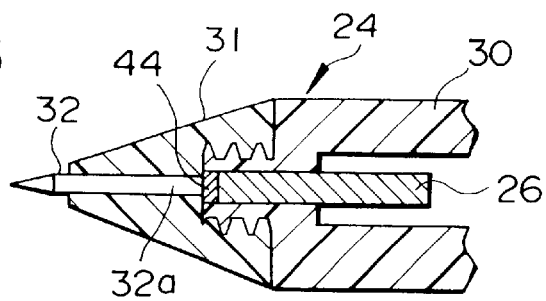
FIG. 3 is a cross-section view of a probe head showing an example for the case where a buffer plate is disposed between a metallic pin and an electrooptic element in the electrooptic probe of FIG. 1.

For example, as shown in FIG. 3, a buffer plate 44 is provided between the electrooptic element 26 and the base end 32a of the metallic pin 32 so that at the time of attaching and detaching the tip member 31, shock occurring between the metallic pin 32 and the electrooptic element 26 can be absorbed. In this case, the danger of occurrence of damage to the electrooptic element 26 is minimized so that the durability of the electrooptic probe 21 can be improved.

Figure 4:
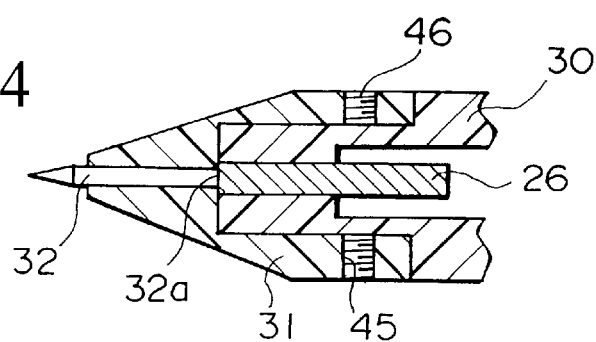
FIG. 4 is a cross-section view of a probe head showing a condition when a tip member and a head body are secured by a different means to that of FIG. 1.
Figure 5:
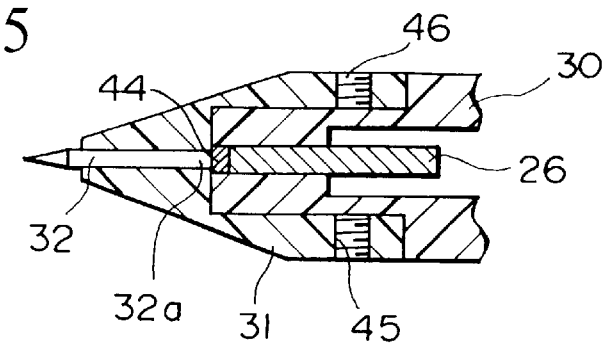
FIG. 5 is a cross-section view showing an example for the case where a buffer plate is disposed between a metallic pin and an electrooptic element in the probe head of FIG. 4.

Moreover, the means for securing the tip member 31 to the head body 30 is not limited to that of the above embodiment. For example, a male threaded portion may be provided on the tip member 31 side and a female threaded portion may be provided on the head body 30 side. Furthermore, as shown in FIG. 4, a threaded aperture 45 may be provided in the tip member 31 and a screw 46 may be disposed in the threaded aperture 45. In this way, the tip member 31 may be secured to the head body 30. Of course, in this case also, as shown in FIG. 5, a buffer plate 44 may be provided between the electrooptic element 26 and the base end 32a of the metallic pin 32.

Figure 6:
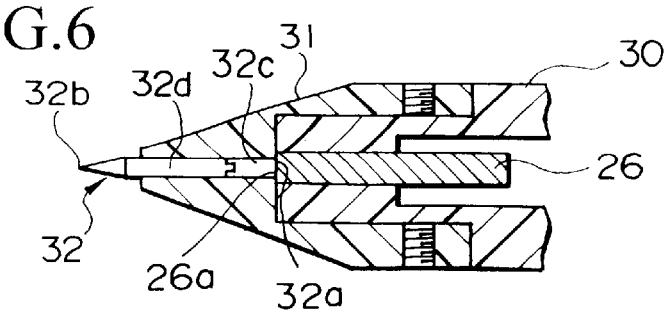
FIG. 6 is a cross-section view showing an example for the case where the metallic pin is divided into a base end portion and a tip end portion, in the probe head of FIG. 4.
Figure 7:
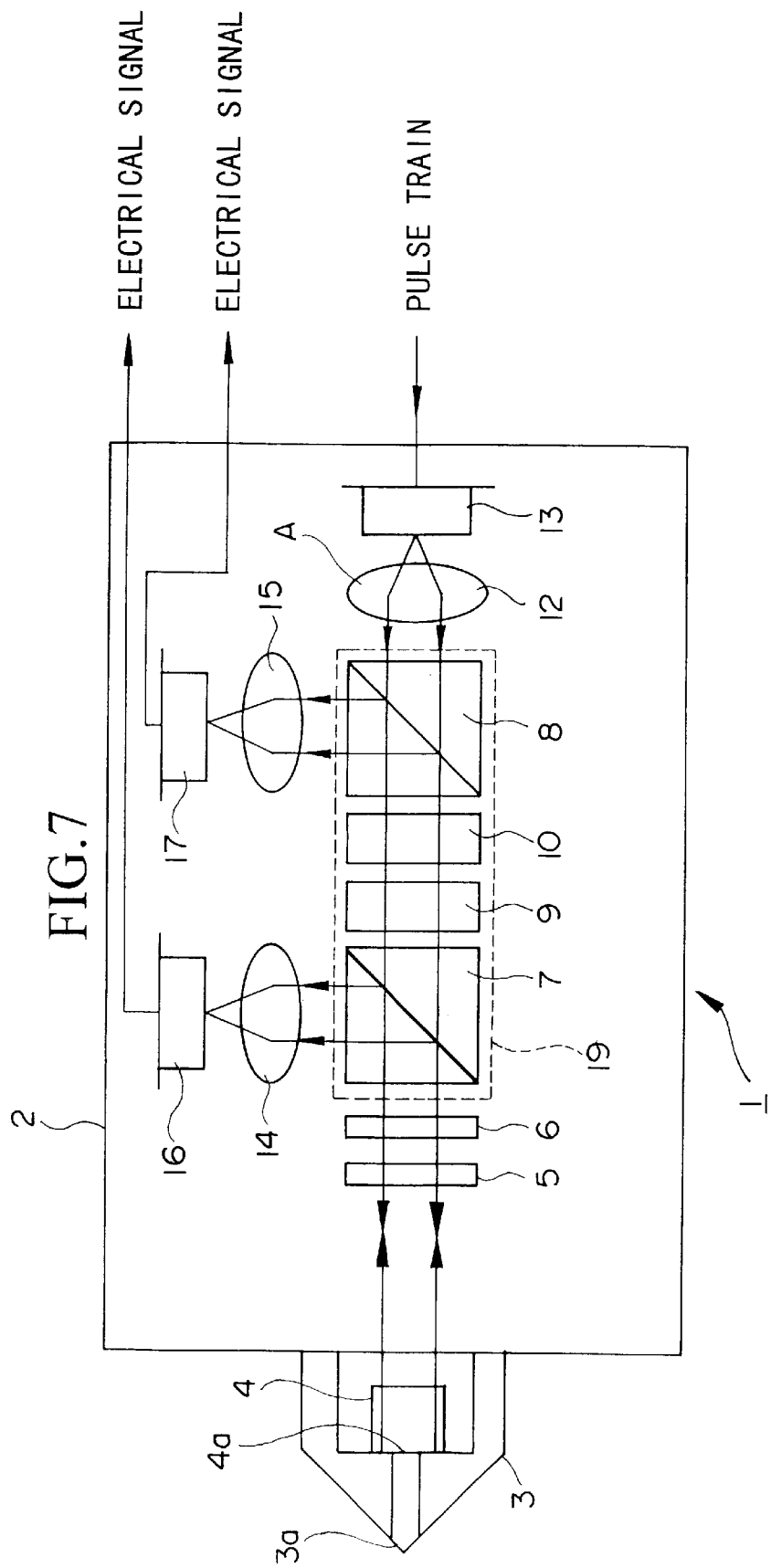
FIG. 7 is a simplified diagram of the electrooptic probe schematically showing the conventional technology of the present invention.

Furthermore, with a different arrangement, as shown in FIG. 6, the metallic pin 32 may be divided into a base end portion 32c and a tip end portion 32d, with the base end portion 32c secured to the electrooptic element 26 and the tip end portion 32d secured to the tip member 31, and when the tip member 31 is attached to the head body 30, the base end portion 32c and the tip end portion 32d are connected together as one.

By means of the above, the positional relation between the base end 32a of the metallic pin 32 and the electrooptic element 26 can be kept constant so that highly accurate measurement can be realized. Moreover, in this case, if silver paste is disposed between the base end portion 32c and the tip end portion 32d, then these can be better connected as one.

Moreover, in the above-described embodiment, if a continuous beam is emitted from the laser diode 25, signal measurement by a conventional general measuring device such as a real time oscilloscope, a sampling oscilloscope, or a spectrum analyzer is possible. In this case, in place of the EOS oscilloscope, a real time oscilloscope, a sampling oscilloscope, or a spectrum analyzer can be connected to the photodiodes 41 and 42, via a dedicated controller.

What is claimed is:

1. An electrooptic probe comprising:
   an optical path formed within a probe body between a base end portion and a tip end portion of said probe body;

a laser diode disposed at an end of said optical path on the base end portion side of said probe body;

an electrooptic element disposed at an other end of said optical path on the tip end portion side of said probe body and retained in a probe head constituting the tip end portion of said probe body;

a metallic pin provided in said probe head with a base end thereof connected to said electrooptic element, and a tip end thereof protruding from said probe head, wherein a laser beam emitted from said laser diode is incident on said electrooptic element via said optical path, and this incident beam is reflected by a reflecting film provided on said electrooptic element, and the reflected beam thereof is separated and converted into an electrical signal by a photodiode; and wherein said probe head includes a head body for retaining said electrooptic element, and a tip member detachably provided on said head body for retaining said metallic pin; and wherein said electrooptic element and the base end of said metallic pin are connected to each other through a buffer plate for absorbing shock due to contact between said electrooptic element and said metallic pin.

2. An electrooptic probe according to claim 1, wherein said photodiode and said laser diode are connected to an electrooptic sampling oscilloscope, and said laser diode generates said laser beam as a pulsed beam based on a control signal from said electrooptic sampling oscilloscope.

3. An electrooptic probe according to claim 2, wherein a male threaded portion is provided in one of said head body and said tip member protruding towards the other of the two, while in the other of the two, a female threaded portion is formed for engaging with said male threaded portion, and said male threaded portion and said female threaded portion are able to be engaged and disengaged.

4. An electrooptic probe according to claim 2, wherein a threaded aperture is provided in said tip member, and said tip member is secured to said head body by means of a screw disposed in said threaded aperture.

5. An electrooptic probe according to claim 2, wherein said electrooptic element and the base end of said metallic pin are connected to each other through the medium of a buffer plate for absorbing shock due to contact between said electrooptic element and said metallic pin.

6. An electrooptic probe according to claim 1, wherein said laser diode generates a continuous beam as said laser beam.

7. An electrooptic probe according to claim 6, wherein a male threaded portion is provided in one of said head body and said tip member protruding towards the other of the two, while in the other of the two, a female threaded portion is formed for engaging with said make threaded portion, and said male threaded portion and said female threaded portion are able to be engaged and disengaged.

8. An electrooptic probe according to claim 6, wherein a threaded aperture is provided in said tip member, and said tip member is secured to said head body by means of a screw disposed in said threaded aperture.

9. An electrooptic probe according to claim 1, wherein said buffer plate is provided between one end of the metallic pin and one end of the electrooptic element.

* * * * *